(12) United States Patent
Gatineau et al.

(10) Patent No.: US 8,092,721 B2
(45) Date of Patent: Jan. 10, 2012

(54) DEPOSITION OF TERNARY OXIDE FILMS CONTAINING RUTHENIUM AND ALKALI EARTH METALS

(75) Inventors: Satoko Gatineau, Ibaraki (JP); Julien Gatineau, Ibaraki (JP); Christian Dussarrat, Wilmington, DE (US)

(73) Assignees: L'Air Liquide Societe Anonyme pour l'Etude Et l'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 309 days.

(21) Appl. No.: 12/411,782

(22) Filed: Mar. 26, 2009

(65) Prior Publication Data
US 2009/0242852 A1 Oct. 1, 2009

Related U.S. Application Data

(60) Provisional application No. 61/039,516, filed on Mar. 26, 2008.

(51) Int. Cl.
| | |
|---|---|
| H01B 1/02 | (2006.01) |
| H01B 1/12 | (2006.01) |
| H01B 1/00 | (2006.01) |
| B05D 5/12 | (2006.01) |
| B05D 3/00 | (2006.01) |
| C23C 16/00 | (2006.01) |
| C23C 16/40 | (2006.01) |
| H01T 14/00 | (2006.01) |
| H05H 1/48 | (2006.01) |
| H05B 6/02 | (2006.01) |
| H05B 6/24 | (2006.01) |
| H01L 21/00 | (2006.01) |
| H01L 29/02 | (2006.01) |

(52) U.S. Cl. ......... 252/521.1; 427/79; 427/81; 427/123; 427/126.3; 427/248.1; 427/255.19; 427/255.28; 427/398.4; 427/580; 427/591; 438/3; 438/99; 438/218; 438/253; 438/396; 438/484; 438/575; 438/652; 118/715; 118/724; 257/E21.011; 257/300; 505/100; 505/120; 556/136; 556/140; 534/15; 546/2; 252/500

(58) Field of Classification Search ............ 427/255.28, 427/248.1, 350, 398.4, 255.19, 580, 591, 427/79, 81, 123, 126.3, 96.1, 96.8, 97.1, 427/98.6, 98.9; 257/300, E21.011; 118/715; 118/724; 438/396, 571, 575, 3, 652, 745; 438/218, 484, 99, 253; 505/100, 120; 534/15; 546/2; 556/136, 40; 252/500, 521.1
See application file for complete search history.

(56) References Cited

U.S. PATENT DOCUMENTS

| | | | | |
|---|---|---|---|---|
| 4,927,670 A | * | 5/1990 | Erbil ............................ | 505/447 |
| 5,496,582 A | | 3/1996 | Mizutani et al. | |
| 5,840,897 A | * | 11/1998 | Kirlin et al. ........................ | 546/2 |
| 7,316,962 B2 | | 1/2008 | Govindarajan | |
| 2002/0164887 A1 | * | 11/2002 | Tomita et al. .................. | 438/745 |
| 2003/0073294 A1 | * | 4/2003 | Marsh ............................ | 438/484 |
| 2008/0152793 A1 | * | 6/2008 | Gatineau et al. ............ | 427/126.1 |
| 2009/0236568 A1 | * | 9/2009 | Letessier et al. ............ | 252/518.1 |
| 2010/0221577 A1 | * | 9/2010 | Dussarrat ...................... | 428/702 |

FOREIGN PATENT DOCUMENTS

| | | |
|---|---|---|
| EP | 1 717 343 | 11/2006 |
| WO | WO 00 15865 | 3/2000 |
| WO | WO 2004 046417 | 6/2004 |
| WO | WO 2008 088563 | 7/2008 |

OTHER PUBLICATIONS

STREM MSDS (Ruthenocene Oct. 2004) {http://www.strem.com/catalog/v3/44-6200/}.*
International Search Report for PCT/IB2009/051276.
Burkey, D.J. et al. "Encapsulated alkaline-earth metallocenes. 2. Triisopropylcyclopentadienyl systems, $[(C_3H_7)_3C_5H_2]_2Ae(THF)_n$ (Ae=Ca, Sr, Ba; n=0-2), and the crystal structure of $[(C_3H_7)_3C_5H_2]_2Ba(THF)_2$." Organometallics, vol. 12, No. 4, 1993, pp. 1331-1337.
Kang, J. et al. "Metal-organic CVD of a (Ba,Sr)RuO$_3$ oxide electrode using a single cocktail source." Chemical Vapor Deposition, vol. 11, No. 1, Jan. 1, 2005, pp. 17-20.
Vehkamaki, M. et al. "Atomic Layer Deposition of BaTiO$_3$ thin films—Effect of barium hydroxide formation." Chemical Vapor Deposition, vol. 13, No. 5, May 1, 2007, pp. 239-246.
Kukli, K. et al. "Atomic layer deposition of calcium oxide and calcium hafnium oxide films using calcium cyclopentadienyl precursor." Thin Solid Films, vol. 500, No. 1-2, Apr. 3, 2006, pp. 322-323.
Hatanpää, T. et al. "Synthesis and characterisation of cyclopentadienyl complexes of barium: Precursors for atomic layer deposition of BaTiO$_3$." Dalton Transactions, Mar. 8, 2004, pp. 1181-1188.
Shibuya, K. et al. "Domain structure of epitaxial CaHfO$_3$ gate insulator films on SrTiO$_3$", Appl. Phys. Let. 84 (2004) 2142-2144.
Shibuya, K. et al. "Growth and structure of wide-gap insulator films on SrTiO$_3$", Solid State Electron., 47 (2003) 2211-2214.
Studebaker, D. et al. "Low field, room temperature magnetoresistance in $(La_{1-x}M_x)_y MnO_{3-\delta}$ (M=Ca, Sr) thin-films deposited by liquid delivery CVD". Materials Science and Engineering B56 (1998) pp. 168-172.
IPRP and Written Opinion for related PCT/IB2009/051276 dated Jul. 6, 2009.
Int'l Search Report, IPRP, and Written Opinion for related PCT/IB2009/051153 dated Nov. 26, 2009.
Shibutani, T. et al. "A novel ruthenium precursor for MOCVD without seed ruthenium layer". Tosch R&D Review, 47, 2003.
Frohlich, K. et al. "Preparation of SrRuO$_3$ films for advanced CMOS metal gates". Material Science in Semiconductor Processing 7 (2004) pp. 265-269.

* cited by examiner

Primary Examiner — Milton I Cano
Assistant Examiner — Aaron Greso
(74) Attorney, Agent, or Firm — Patricia E. McQueeney

(57) ABSTRACT

Methods and compositions for the deposition of ternary oxide films containing ruthenium and an alkali earth metal.

9 Claims, No Drawings

US 8,092,721 B2

DEPOSITION OF TERNARY OXIDE FILMS CONTAINING RUTHENIUM AND ALKALI EARTH METALS

CROSS REFERENCE TO RELATED APPLICATIONS

The present application claims the benefit of U.S. Provisional Application Ser. No. 61/039,516, filed Mar. 26, 2008, herein incorporated by reference in its entirety for all purposes.

BACKGROUND

1. Field of the Invention

This invention relates generally to compositions, methods and apparatus for use in the manufacture of semiconductor, photovoltaic, LCD-TFT, or flat panel type devices. More specifically, the invention relates to methods and compositions for depositing ternary oxide films on a substrate.

2. Background of the Invention

As the design and manufacturing of semiconductor devices continues to evolve, the semiconductor industry is constantly seeking new and novel methods of depositing films onto substrates, such that the resulting film will have certain sought after properties. One example of these properties can be found in metal electrodes to be employed in advanced CMOS technologies together with high-k dielectric films. For the next generation nodes, ruthenium is considered as the best candidate for electrode for FeRAM and DRAM applications, and potentially for MRAM. One reason for this is that the resistibility of ruthenium is lower than iridium and platinum. Additionally, even $RuO_2$ has better conductivity than the two corresponding metal oxides in the case where a metal layer is in contact with high-k layers. Recent researches mentioned the use of ruthenium-based materials, $CaRuO_3$, $SrRuO_3$ and $BaRuO_3$, as an electrode for ferroelectric applications. Ternary oxicdes such as $ARuO_3$ (A=Ca, Sr and Ba) complexes show perovskite crystal structure and could be grown epitaxially on several types of insulation oxide layers. Hence, it is thought that $ARuO_3$ films may be suitable to be deposited on gate stack structures. Furthermore, such films have suitable metallic conductivity.

As the size of chip becomes smaller and smaller, each layer deposited thereon should be thinner and thinner, making deposition techniques such as chemical vapor deposition (CVD) or atomic layer deposition (ALD) desirable to deposit these layers.

A large variety of Ru precursors are available and many have been studied in CVD or ALD mode. However, most of them have recurrent drawbacks: low vapor pressure (e.g. 0.25 Torr at 85° C. for $Ru(EtCp)_2$), high impurity contents of the obtained films (e.g. carbon and oxygen in most of the cases), long incubation time, poor adherence, and non-uniformity in deep trenches.

In some cases, precursors are not liquid and need to be dissolved in a solvent or mixture of solvents to allow an easy delivery of the vapors to the reaction chamber Moreover, the solvents that are used are usually toxic and/or flammable and their usage brings many constraints (safety aspects, environmental issues). Besides, the use of precursors with melting points higher than 20° C. implies many additional constraints during the process deposition (heating of the delivery lines to avoid condensation of the precursor at undesired locations) and during the transportation.

The number of known strontium and barium precursors available for vapor deposition is low compared to ruthenium. Many strontium and barium precursor are solid with a high melting point (above 200° C.), and their vapor pressure is low, which generates throughput and equipment issues. Stability may also a problem because the temperature at which the precursor reacts with an oxidizing agent corresponds to its decomposition temperature.

Consequently, there exists a need for ruthenium precursors with good reactivity and incubation time properties, which can be combined with alkali earth metal precursors which have a melting point less than about 200° C. to form ternary oxide films, and which precursors may be dissolved in a suitable solvent to aid in the deposition process.

BRIEF SUMMARY

In an embodiment, a method for forming a ternary oxide film on one or more substrates comprises providing at least one substrate disposed in a reactor. A ruthenium precursor in vapor form is introduced into the reactor, where the ruthenium precursor is either ruthenium tetraoxide or a precursor with the general formula:

$$(L)_m Ru(L')_n$$

wherein L is an unsaturated, cyclic or linear, $\eta^4$-$\eta^6$ type hydrocarbon ligand; L' is a linear or branched ligand, independently selected from a carbonyl, an amidinate, a β-diketonato, an alkyl, an alkoxy, hydrogen, an alkylamino; a halogen; diketimine; an enaminoketones; diazabutadiene; ethyleamine; or formamidine, and $0 \leq n$ or $m \leq 3$. An alkali earth metal precursor in vapor form is introduced into the reactor, where the alkali earth metal precursor has the general formula:

$$A(R_xCp)_2R'_y$$

wherein A is either calcium, strontium, or barium; R is a linear or branched ligand selected from a C1-C4 alkyl group, an alkoxy, a silyl, or a halogen; R' is a linear or cyclic hydrocarbon ligand which contains N, P, or O; $0 \leq x \leq 5$; and $0 \leq y \leq 2$. At least part of the ruthenium and alkali earth metal precursors are deposited to form a ternary oxide film on at least one of the substrates.

Other embodiments of the current invention may include, without limitation, one or more of the following features:
  the L ligand comprises a substituted or unsubstituted ligand selected from: butadiene; butadienyl; cyclopentadiene; cyclopentadienyl; pentadiene; pentadienyl; hexadiene; hexadienyl; cyclohexadiene; cyclohexadienyl; heptadiene; heptadineyl; norbornadiene; octadiene; cylcooxtadiene; and cyclooctadienyl;
  the R' ligand comprises a ligand selected from: tetrahydrofuran; dioxane; dimethoxyethane; dimethoxyethane; and pyridine;
  the alkali earth metal precursor has a melting point less than about 100° C., and is preferably a liquid at about 25° C.;
  the ruthenium precursor is selected from: ruthenium tetraoxide; ruthenium(cyclopentadienyl)$_2$; ruthenium(methylcyclopentadienyl)$_2$; ruthenium(ethylcyclopentadienyl)$_2$; ruthenium(isopropylcyclopentadienyl)$_2$; ruthenium(CO)$_3$(1-methyl-1,4-cyclohexadien2); ruthenium(2,6,6-trimethylcyclohexadienyl)$_2$; ruthenium(dimethylpentadienyl)$_2$; (cyclopentadienyl)ruthenium(dimethylpentadienyl); (ethylcyclopentadienyl)ruthenium(dimethylpentadienyl); ruthenium(toluene)(1,4-cyclohexadiene); (cyclopentadienyl)ruthenium(amidinate); and ruthenium(CpMe$_5$)(iPr-amindate).
  the alkali earth metal precursor is selected from: Ca(MeCp)$_2$(THF)$_z$; Sr(MeCp)$_2$(THF)$_z$; Ba(MeCp)$_2$ (THF)$_z$; Ca(MeCp)$_2$(DME)$_z$; Sr(MeCp)$_2$(DME)$_z$; Ba(MeCp)$_2$(DME)$_z$ Ca(MeCp)$_z$; Sr(MeCp)$_z$; Ba(MeCp)$_z$; Ca(EtMeCp)$_2$(THF)$_z$; Sr(EtCp)$_2$(THF)$_z$; Ba(EtCp)$_2$(THF)$_z$; Ca(EtCp)$_2$(DME)$_z$; Sr(EtCp)$_2$(DME)$_z$; Ba(EtCp)$_2$(DME)$_z$; Ca(EtCp)$_z$; Sr(EtCp)$_2$, Ba(EtCp)$_2$, Ca(iPrCp)$_2$(THF)$_n$, Sr(iPrCp)$_2$(THF)$_z$; Ba(iPrCp)$_2$(THF)$_z$; Ca(iPrCp)$_2$(DME)$_z$; Sr(iPrCp)$_2$(DME)$_z$; Ba(iPrCp)$_2$(DME)$_z$; Ca(iPrCp)$_2$, Sr(iPrCp)$_2$, Ba(iPrCp)$_2$, Ca(iPr$_3$ Cp)$_2$(THF)$_z$; Sr(iPr$_3$ Cp)$_2$(THF)$_z$; Ba(iPr$_3$ Cp)$_2$(THF)$_z$; Ca(iPr$_3$ Cp)$_2$(DME)$_z$; Sr(iPr$_3$ Cp)$_2$ (DME)$_z$; Ba(iPr$_3$ Cp)$_2$(DME)$_z$; Ca(iPr$_3$ Cp)$_2$, Sr(iPr$_3$ Cp)$_2$, Ba(iPr$_3$ Cp)$_2$, Ca(tBuCp)$_2$(THF)$_z$; Sr(tBuCp)$_2$ (THF)$_z$; Ba(tBuCp)$_2$(THF)$_z$; Ca(tBuCp)$_2$(DME)$_z$; Sr(tBuCp)$_2$(DME)$_z$; Ba(tBuCp)$_2$(DME)$_z$; Ca(tBuCp)$_2$, Sr(tBuCp)$_2$, Ba(tBuCp)$_2$, Ca(tBu$_3$ Cp)$_2$(THF)$_z$; Sr(tBu$_3$ Cp)$_2$(THF)$_z$; Ba(tBu$_3$ Cp)$_2$(THF)$_z$; Ca(tBu$_3$ Cp)$_2$ (DME)$_z$; Sr(tBu$_3$ Cp)$_2$(DME)$_z$; Ba(tBu$_3$ Cp)$_2$(DME)$_z$; Ca(tBu$_3$ Cp)$_2$, Sr(tBu$_3$CP)$_2$, and Ba(tBu$_3$ Cp)$_2$; and wherein $0 \leq z \leq 3$;

the alkali earth metal precursor is initially supplied dissolved in a solvent, and the solvent has a boiling point greater than the melting point of the precursor;

the solvent has a boiling point greater than 100° C., preferably greater than about 150° C.;

an oxygen containing reactant is introduced into the reactor, and the reactant is selected from: $O_2$; $O_3$; $H_2O$; $H_2O_2$; $N_2O$; NO; $NO_2$; and mixtures thereof;

the ternary oxide film is deposited through either a chemical vapor deposition (CVD) process or through an atomic layer deposition process;

the deposition process is performed at a temperature between 100° C. and about 500° C.; and the ternary film is treated post deposition in an oxidizing atmosphere, and the treatment is at a temperature higher than that of the deposition process.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

NOTATION AND NOMENCLATURE

Certain terms are used throughout the following description and claims to refer to various components and constituents. This document does not intend to distinguish between components that differ in name but not function.

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group; and the abbreviation "Cp" refers to a cyclopentadienyl group.

As used herein, the term "independently" when used in the context of describing R groups should be understood to denote that the subject R group is not only independently selected relative to other R groups bearing different superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

DESCRIPTION OF PREFERRED EMBODIMENTS

Embodiments of the present invention provide novel methods and compositions for the deposition of a ternary oxide film on a substrate. In general, the compositions and methods utilize a ruthenium precursor and an alkali earth metal precursor.

In some embodiments, the ruthenium precursor may have the general formula:

where M is ruthenium; L is a substituted or unsubstituted ligand selected from butadiene, butadienyl, cyclopentadiene, cyclopentadienyl, pentadiene, pentadienyl, hexadiene, hexadienyl, cyclohexadiene, cyclohexadienyl, heptadiene, heptadineyl, norbornadiene, octadiene, cylcooxtadiene, and cyclooctadienyl; L' is a linear or branched ligand selected from a carbonyl, a carbine, an amidinate, a β-diletonato, an alkyl, an alkoxy, hydrogen, an alkylamino; a halogen; diketimine; an enaminoketones; diazabutadiene; ethyleamine; and formamidine; and $0 \leq n$ or $m \leq 3$.

In some embodiments the alkali earth metal precursor may have the general formula:

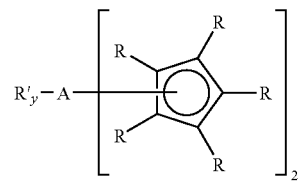

wherein A is calcium, strontium, or barium; R is a linear or branched ligand selected from an alkyl group (e.g. Me, Et, nPr, IPr, nBu, tBu), an alkoxy, a silyl and a halogen; R' is a linear or cyclic hydrocarbon ligand which contains N, P or O (e.g. tetrahydrofuran, dioxane, dimethoxyethane, dimethoxyethane, pyridine); and $0 \leq y \leq 2$.

In some embodiments, either the ruthenium precursor or the alkali earth metal precursor may be dissolved in a solvent. In these embodiments, the solvent should have a boiling point greater than 100° C., preferably greater than about 150° C. The solvent may be distilled under an inert gas (e.g. nitrogen, argon, etc) to remove moisture and/or dissolved oxygen. Typically, the solvent should have good affinity with the precursors at room temperature, and have as a property a boiling point greater than the melting point of the precursor itself. Table 1 lists an non-exhaustive list of suitable solvents.

TABLE 1

Examples of solvents

| Name | Formula (F.W.) | b.p. [C.] | Density [g/cm3] | Viscosity [cP] @25 C. |
|---|---|---|---|---|
| Octane | $C_8H_8$ (114.23) | 125 | 0.7 | 0.51 |
| Toluene | $C_6H_5CH_3$ (92.14) | 111 | 0.87 | 0.54 |
| Xylene | $C_6H_4(CH_3)_2$ (106.16) | 138.5 | 0.86 | 0.6 |
| Mesitylene | $C_6H_3(CH_3)_3$ (120.2) | 165 | 0.86 | 0.99 |
| Ethylbenzene | $C_6H_5C_2H_5$ (106.17) | 136 | 0.87 | 0.67 |
| Propylbenzene | $C_6H_5C_3H_7$ (120) | 159 | 0.86 | 0.81 |
| Ethyl toluene | $C_6H_4(CH_3)(C_2H_5)$ (120.19) | 160 | 0.86 | 0.63 |
| Ethylcyclohexane | $C_6H_{11}C_2H_5$ (112) | 132 | 0.78 | |
| Propylcyclohexane | $C_6H_{11}C_3H_7$ (126.1) | 156.8 | 0.79 | 0.85 |
| Tetrahydrofuran | $C_4H_8O$ (72.11) | 66 | 0.89 | 0.46 |
| Dioxane | $C_4H_8O_2$ (88.11) | 101.1 | 1.03 | 1.2 |
| 1,2-diethoxyethane | $C_2H_5O(CH_2)_2OC_2H_5$ (118.17) | 121 | 0.8 | |
| Diethylene glycol dimethylether | $CH_3O(CH_2)_2O(CH_2)_2OCH_3$ (134.2) | 162 | 0.95 | 1.1 |
| Ethoxybenzene | $C_6H_5OC_2H_5$ (122.17) | 173 | 0.96 | 1.1 |
| Pyridine | $C_5H_5N$ (79.1) | 115 | 0.98 | 0.94 |
| Dimethyl sulfoxide | $(CH_3)_2S=O$ (78.13) | 189 | 1.1 | 2.0 |
| Limonene | $C_{10}H_{16}$ (136.24) | 176 | 0.84 | 0.9 |

In some embodiments, the alkali earth metal precursor may be initially dissolved in mesitylene, and the ruthenium precursor may be initially dissolved in at least one solvent selected from: Methyl perfluoropropyl ether; methyl nonafluorobutyl ether; ethyl nonafluorbutyl ether; 1,1,1,2,2,3,4,5,5,5-decafluoro-3-methoxy-4-(trifluoromethyl)-Pentane; 3-ethoxy-1,1,1,2,3,4,4,5,5,6,6,6-dodecafluoro-2-trifluoromethyl-hexane; $C_9F_{12}N$; $C_{12}F_{27}N$; $C_{12}F_{33}N$; $C_6F_{14}$; $C_8F_{16}$; $C_7F_{16}$; $C_5F_{10}H_2$; $C_4F_{15}H$; 1,1,2,3,3 penta fluoro propane; CF3CFHCF2CH2OCF2CFHOC3F7; and C3F7OCFHCF2CH(CH3)OCF2CFHOC4F9.

In some embodiments, the ruthenium precursor may be initially dissolved in a mixture of methyl nonafluorbutyl ether and ethyl nonafluorobutyl ether.

The disclosed precursors may be deposited to form a thin film using any deposition methods known to those of skill in the art. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, the ruthenium and alkali earth metal precursors in vapor form are introduced into a reactor. The precursors in vapor form may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium or gold) may be used. The substrate may also have one or more layers of differing materials already deposited upon it.

In some embodiments, in addition to the precursor vapor solutions, a reactant gas may also be introduced into the reactor. The reactant gas may be one of oxygen, ozone, water, hydrogen peroxide, nitric oxide, nitrogen dioxide, nitrous oxide, radical species of these, as well as mixtures of any two or more of these.

The ruthenium, alkali earth metal precursors and any optional reactants may be introduced sequentially (as in ALD) or simultaneously (as in CVD) into the reaction chamber. Generally, when they are introduced simultaneously, the order of their introduction is not critical (e.g. ruthenium precursor may be introduced before the alkali earth metal precursor, and vice versa). In some embodiments, the reaction chamber is purged with an inert gas between the introduction of the precursor and the introduction of the reactant. In one embodiment, the reactant and the precursors may be mixed together to form a reactant/precursor mixture, and then introduced to the reactor in mixture form. In some embodiments, the reactant may be treated by a plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

In some embodiments, the temperature and the pressure within the reactor are held at conditions suitable for ALD or CVD depositions. For instance, the pressure in the reactor may be held between about 1 Pa and $10^5$ Pa, or preferably between about 25 Pa and $10^3$ Pa, as required per the deposition parameters. Likewise, the temperature in the reactor may be held between about 100° C. and about 500° C., preferably between about 150° C. and about 350° C.

In some embodiments, the precursor vapor solutions and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reactant gas, may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

In some embodiments, the ternary oxide film may be treated after deposition. The treatment may involve exposing the deposited ternary oxide film to an oxygen containing reactant (independently selected from oxygen, ozone, water, hydrogen peroxide, nitric oxide, nitrogen dioxide, nitrous oxide, radical species of these, as well as mixtures of any two or more of these), where the exposure takes place at a temperature greater than that at which the ALD or CVD deposition process occurred. In this way, the resultant ternary film may be treated or cured to increase the desirable properties of the resultant film.

EXAMPLES

The following non-limiting examples are provided to further illustrate embodiments of the invention. However, the examples are not intended to be all inclusive and are not intended to limit the scope of the inventions described herein.

$Ru(CO)_3$(1-methyl-1,4-cyclohexadiene) is a slight yellow liquid precursor and the vapor pressure is higher than 1 Torr at 80° C. Therefore its vapor is suitable to be introduced to a chamber/reactor by inert gas bubbling at 25° C.

$Sr(iPr_3 Cp)_2(THF)_2$ is an off white powder and dissolves in mesitylene with 0.1 mol/L at least. Its melting point is 94° C. and its vapor pressure is 1 Torr at 180 C. Therefore its vapor can be introduced to the chamber by bubbling or liquid delivery.

Deposition of SRO Films by CVD:

The two precursors were used to deposit $SrRuO_3$ films by reaction with $H_2O$ at 200° C. The ruthenium precursor was stored in a bubbler and its vapors were delivered to the hot-wall reactor by a bubbling method. The strontium precursor was stored in a canister and heated to a temperature where the compound is liquid in order to allow a bubbling delivery method and/or was dissolved in mesitylene and delivered to the reaction chamber by using liquid delivery system or by bubbling technique. An inert gas, helium or nitrogen, was used as a carrier gas, as well as for dilution purpose.

Films were deposited from 200° C., at 0.5 Torr, and the deposition rate reached a plateau at 300° C. Depositions were done on TiN films as well as on other electrode materials. The concentration of various elements into the SRO films was analyzed by an Auger spectrometer and SIMS, the stochiometry verified by RBS. It was proven that the carbon content in the film was very low, and that we obtained 1:1:3 stoichiometric films.

Deposition of SRO Films by ALD:

The same precursors were used to deposit films in ALD mode at low temperatures (150-350° C.) using a mixture of $H_2O$ in oxygen as a co-reactant. Films with similar characteristics as in the CVD mode were obtained (good stochiometry, no C intrusion), as well as good step coverage in deep trenches.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for forming a ternary oxide film on one or more substrates; comprising:
   a) providing at least one substrate disposed in a reactor;
   b) introducing a ruthenium precursor in vapor form into the reactor; wherein the ruthenium precursor is ruthenium (2,6,6-trimethylcyclohexadienyl)$_2$;
   c) introducing an alkali earth metal precursor in vapor form into the reactor; wherein the alkali earth metal precursor is $Sr(tBu_3Cp)_2$;
   d) depositing at least part of the ruthenium and alkali earth metal precursors to form a ternary oxide film on at least one of the substrates.

2. The method of claim 1, wherein the alkali earth metal precursor has a melting point of less than about 100° C.

3. The method of claim 2, wherein the alkali earth metal precursor is a liquid at about 25° C.

4. The method of claim 1, wherein the alkali earth metal precursor or the ruthenium precursor is initially supplied dissolved in a solvent, wherein the solvent has a boiling point greater than the melting point of the precursor dissolved therein.

5. The method of claim 4, where the solvent has a boiling point greater than about 100° C.

6. The method of claim 1, further comprising introducing an oxygen containing reactant into the reactor; wherein the reactant comprises at least one member selected from: $O_2$; $O_3$; $H_2O$; $H_2O_2$; $N_2O$; NO; $NO_2$; and mixtures thereof.

7. The method of claim 1, further comprising depositing the precursors to form the ternary oxide film through either a chemical vapor deposition (CVD) process or an atomic layer deposition (ALD) process.

8. The method of claim 7, wherein the deposition process is performed at temperature between about 100° C. and about 500° C.

9. The method of claim 8, further comprising post-treating the ternary film in oxidizing atmosphere, wherein the post treating occurs at a temperature higher than that of the deposition process.

* * * * *